US006537137B2

(12) United States Patent
Oliver

(10) Patent No.: US 6,537,137 B2
(45) Date of Patent: Mar. 25, 2003

(54) METHODS FOR CHEMICAL-MECHANICAL POLISHING OF SEMICONDUCTOR WAFERS

(75) Inventor: Michael R. Oliver, Portland, OR (US)

(73) Assignee: Rodel Holdings, INC, Wilmington, DE (US)

( * ) Notice: Subject to any disclaimer, the term of this patent is extended or adjusted under 35 U.S.C. 154(b) by 189 days.

(21) Appl. No.: 09/833,309

(22) Filed: Apr. 12, 2001

(65) Prior Publication Data

US 2001/0036798 A1 Nov. 1, 2001

Related U.S. Application Data

(63) Continuation-in-part of application No. 09/498,267, filed on Feb. 3, 2000, now Pat. No. 6,245,679, which is a continuation-in-part of application No. 09/363,540, filed on Jul. 29, 1999, now Pat. No. 6,030,899, which is a continuation-in-part of application No. 08/912,144, filed on Aug. 15, 1997, now Pat. No. 5,932,486, said application No. 09/498,267, is a continuation-in-part of application No. 09/384,607, filed on Aug. 27, 1999, now Pat. No. 6,375,559, which is a continuation-in-part of application No. 09/049,864, filed on Mar. 27, 1998, now Pat. No. 6,099,394, which is a continuation-in-part of application No. 09/021,437, filed on Feb. 10, 1998, now Pat. No. 6,022,264.

(60) Provisional application No. 60/196,672, filed on Apr. 12, 2000, provisional application No. 60/024,114, filed on Aug. 16, 1996, provisional application No. 60/042,115, filed on Mar. 28, 1997, provisional application No. 60/041,844, filed on Apr. 9, 1997, provisional application No. 60/064,875, filed on Nov. 6, 1997, and provisional application No. 60/037,582, filed on Feb. 10, 1997.

(51) Int. Cl.⁷ ................................................. B24B 1/00
(52) U.S. Cl. ........................ 451/41; 451/36; 438/691; 438/692; 156/345.11; 156/345.12; 216/88
(58) Field of Search ..................... 451/41, 36; 438/692, 438/691, 693, 745; 156/345.11, 345.12; 216/88

(56) References Cited

U.S. PATENT DOCUMENTS

| | | |
|---|---|---|
| 2,806,772 A | 9/1957 | Robie |
| 3,549,439 A | 12/1970 | Kaveggia et al. |
| 4,141,180 A | 2/1979 | Gill, Jr. et al. |
| 4,680,893 A | 7/1987 | Cronkhite et al. |
| 4,799,939 A | 1/1989 | Bloecher et al. |
| 4,918,870 A | 4/1990 | Torbert et al. |
| 5,209,760 A | 5/1993 | Wiand |
| 5,245,796 A | 9/1993 | Miller et al. |
| 5,435,816 A | 7/1995 | Spurgeon et al. |
| 5,441,598 A | 8/1995 | Yu et al. |
| 5,487,697 A | 1/1996 | Jensen |
| 5,489,233 A | 2/1996 | Cook et al. |
| 5,626,715 A | 5/1997 | Rostoker |
| 5,647,879 A | 7/1997 | Kubo |

OTHER PUBLICATIONS

Brown, Norman J., "Lapping—Polishing and Shear Mode Grinding", Livermore National Laboratory.
Primak, William, The Vitreous Silica Surface;C consequences of Grinding and Polishing, Physics of Chemistry and Glass, vol. 22, No. 2, Apr. 1981.
Cook, Lee M., "Chemical Processes in Glass Polishing," Journal of Non–Crystalline Solids 120, pp. 152–171, 1990.

*Primary Examiner*—Eileen P. Morgan
(74) *Attorney, Agent, or Firm*—Kenneth A. Benson

(57) ABSTRACT

Method for polishing the surface of a semiconductor wafer is provided in which the polishing pad has on its surface a multiplicity of abrasive particles which contact the wafer surface in combination with a reactive liquid solution essentially free of abrasive particles wherein the ionic strength of the solution is changed to effect a change in polishing.

6 Claims, 2 Drawing Sheets

METHODS FOR CHEMICAL-MECHANICAL POLISHING OF SEMICONDUCTOR WAFERS

This Application, which claims the benefit of Provisional Application Serial No. 60/196,672 filed Apr. 12, 2000, is a Continuation-in-Part of application Ser. No. 09/498,267 filed Feb. 3, 2000, U.S. Pat. No. 6,245,679, which is a Continuation-in-Part of application Ser. No. 09/363,540 filed Jul. 29, 1999, U.S. Pat. No. 6,030,899, which is a Continuation of application Ser. No. 08/912,144 filed Aug. 15, 1997, U.S. Pat. No. 5,932,486, which claims priority from U.S. Provisional Application No. 60/024,114 filed Aug. 16, 1996, said application Ser. No. 09/498,267 filed Feb. 3, 2000 is also a Continuation-in-Part of application Ser. No. 09/384,607, filed August 27 U.S. Pat. No. 6,375,559, which is a Continuation of U.S. application Ser. No. 09/049,864 filed Mar. 27, 1998, U.S. Pat. No. 6,099,394, which claims priority from U.S. Provisional Applications Serial No. 60/042,115 filed Mar. 28, 1997, Serial No. 60/041,844 filed Apr. 9, 1997, and Serial No. 60/064,875 filed Nov. 6, 1997 and which is a Continuation-in-Part of U.S. application Ser. No. 09/021,437 filed Feb. 10, 1998, U.S. Pat. No. 6,022,264, which claims priority from U.S. Provisional Application Serial No. 60/037,582 filed Feb. 10, 1997.

BACKGROUND OF THE INVENTION

1. Field of the Invention

The present invention relates to the chemical-mechanical polishing of semiconductor wafers.

2. Description of Related Art

Polishing generally consists of the controlled abrasion of an initially rough surface in order to produce a specular finished surface free from fracture, scratches, and other defects and of a smoothness approaching the atomic level. This is commonly accomplished by rubbing a pad against the surface of the article to be polished (the workpiece) in a rotary motion in combination with a solution containing a suspension of fine submicron particles (the slurry). Commonly employed pads are made from felted wool, urethane-impregnated felted polyester, or various types of polyurethane plastic.

The polishing rate for such a system is determined by the pressures and velocities employed as well as the concentration of slurry particles in contact with the workpiece at any given time. In order to ensure high and uniform polishing rates, polishing pads are commonly textured to improve slurry flow across the workpiece surface. In addition, the reduction in the contact surface area effected by patterning provides higher contact pressures during polishing, further enhancing the polishing rate. All prior art polishing pads known to the inventors require the simultaneous use of a particle-containing slurry to achieve a detectably high polishing rate; the pad used by itself produces no significant removal or smoothing even when a particle-free liquid is used.

While polishing slurries are universally employed, it is also recognized that their use gives rise to significant problems. First, the particles themselves represent a serious source of contamination when polishing is employed on a semiconductor wafer or device. The use of polishing processes in a clean room seems paradoxical, but is currently widely practiced. The presence of these particles in the clean room facility represents the largest single particulate contamination source in that environment.

Second, the quality of the surface produced is highly dependent upon the particle size distribution and composition in the slurry itself. Anomalously large particles, even in extremely small concentrations, are commonly responsible for scratches and other post-polish mechanical defects. These are highly deleterious to the yield of semiconductor devices processed by polishing. For example, the average particle diameter for slurries used to polish semiconductor devices is typically 0.13 microns, while particles 1 micron or larger may cause fracture. At the solids content of these polishing slurries (typically >12%) it is practically impossible to use filtration to remove the oversize particles due to clogging effects on the filter medium. Thus expensive and time consuming efforts have been made to control and reduce oversize particles in the slurries employed. However, there are few practical safeguards against their accidental introduction.

A third, and equally significant problem, is the variation in polishing activity over time when slurries are recirculated. A common practice in many industrial applications of polishing is to reuse or recirculate the polishing slurry to reduce manufacturing cost and the quantity of waste products from the operation. Recirculation of cerium oxide based slurries is commonly employed in the optical industry, for example. However, the activity of polishing slurries are commonly observed to vary with time when recirculated. This may be due to the addition of dross, or polishing byproducts from the substrate into the slurry solution, attrition or breakdown of the polishing particles themselves during use, or chemical changes in the particles which reduce activity. The level of variation in recirculated slurries is unacceptably high for processing semiconductor devices. For example, a major application of polishing of semiconductor wafers is the polishing of $SiO_2$ surface films using slurries containing $SiO_2$ particles. Recirculation of this system is exceedingly difficult because the byproducts of the polishing process are coagulated $SiO_2$ particulates derived from in situ polymerization of waste products in the solution. These are practically impossible to distinguish from the original slurry particles, and it is equally impossible to control their size or remove them from the solution. In consequence, the solid particle content of the recirculated slurry continuously increases with time. As the polishing rate is directly proportional to the solids content of the slurry, practical control of the polishing rate is difficult. A serious additional problem is the accidental incorporation of oversize contaminant particles into the recirculating slurry, often due to substrate breakage. The aforementioned difficulties in filtering slurries make it virtually impossible to remove these contaminants.

Because of the above concerns, recirculation of slurry is not practiced in the polishing of most semiconductor devices because of the need to control activity precisely and the avoidance of damage by contaminants. Slurry is simply used once and disposed of as waste. As a result, the cost of slurry and slurry waste disposal is the single largest contributor to the cost of polishing semiconductor devices.

From the above, it is clear that if a polishing process which did not use particulates and which used a fluid which could easily be recirculated and kept in a constant particulate-free state could be developed, it would be extremely attractive for use in the processing of semiconductor wafers.

A wide variety of apparatus for polishing purposes have been disclosed. The most common type, typified by U.S. Pat. Nos. 4,141,180; 4,680,893 and 4,918,870, is comprised of the following features, as illustrated in FIG. 1. The wafer 1 is held by a fixture, or carrier, 2 which is mounted on a rotatable spindle 3. This rotating carrier assembly is pressed against a rotating table 4 on whose upper surface is affixed a polishing pad 5. The simultaneous rotation of carrier and table effects a lateral movement of the pad against the wafer surface. When slurry is fed onto the pad surface 6, the lateral motion in conjunction with the slurry particles effects the polishing action. Most other prior art polishing apparatus designs use the same basic principle, with lateral motion of pad and wafer being effected by several different means including linear motion (see U.S. Pat. No. 5,487,697, Jensen) and ultrasonic vibration (see U.S. Pat. No. 5,245,796, Miller et al.).

All of the prior art polishing apparatus known employ particulate-containing slurries exclusively. None disclose or require for operation liquid delivery systems which include the ability to recirculate, filter, and control the chemical properties of the liquid employed therein as an integral portion of the apparatus, particularly when that liquid is essentially non-particulate. This is not surprising given the aforementioned difficulties of employing recirculation and filtration systems for particulate-containing polishing slurries.

From the above discussion it is evident that the production of a polishing apparatus which can produce uniform polishing action without the use of said slurry particles, is capable of recirculating the liquids used for polishing for extended periods of time while retaining a constant level of polishing activity, and has the means to continuously remove foreign particulate contaminants and waste products from the polishing process would be a highly desirable advancement of the polishing art, and dramatically reduce the cost of polishing of semiconductor devices.

SUMMARY OF THE INVENTION

There are other advantages that can be achieved with polishing systems using particle-free solutions. One is to change the fluid chemistry to go from one step of polishing to another in a polishing sequence. This is nearly the same as changing slurries in a standard system, except that the abrasive particles held in the pad remain the same. For example, in a standard system, in which the particles are suspended in a slurry, any addition of salts to increase the ionic strength of the solution will lead to increased settling of the suspended particles. Indeed, this increased settling with increased ionic strength is why some slurries are made as two components which are combined when put into a distribution system where the combined slurry will be subject to continuous mixing to prevent particle settling. The availability of increased salt concentration in a fixed abrasive polishing system gives great flexibility. For example, buffering may be improved to control pH more tightly, in some cases resulting in a better controlled polishing process.

Another mechanism that can be used to advantage in a fixed abrasive polishing system is the effect on the double layer around an abrasive particle. For example, if an increased salt content were added to the polishing solution, there will be a collapse or reduction of the double layer thickness on the abrasive particle. This will result in less repulsive force against another surface and, therefore, increased likelihood of increased polishing abrasive/semiconductor wafer surface interaction. Thus, by modification of the ionic strength of the polishing liquid the polishing rate may be increased or decreased during the various stages of the polishing process merely by changing the ionic strength of the solution.

Another aspect of varying the ionic strength would be in a system comprising more than one abrasive type. If the addition of salts and polishing at various pH levels affects the relative polishing activity of different abrasives, then the ability of each abrasive may be turned on and off in a process with a single fixed abrasive pad. Thus, if one polishing step needs abrasive A and a second step needs abrasive B, the addition of salts to modulate their double layers can be used to enhance or suppress the polishing effect of individual abrasives. The effect of using two different slurries with different abrasives in a standard polishing process can be achieved by varying ionic strength of the particle-free solution when used with a pad comprising different types of abrasives.

Another aspect of this invention is a method of polishing a surface of a semiconductor wafer comprising the steps of: providing a polishing pad having a polishing surface comprising a multiplicity of one type of abrasive particle in said polishing surface; holding said wafer in a carrier such that said wafer surface is in contact with said polishing surface; moving said carrier and/or said polishing surface to provide both pressure on said wafer surface and relative lateral motion between said wafer surface and said polishing surface; and providing a reactive liquid solution essentially free from particulate matter at an interface between said wafer surface and said polishing surface, wherein a change in polishing conditions is effected by changing the ionic strength of said reactive liquid solution.

The preferred type of abrasive particle for use in this invention is a metal oxide, such as alumina, chromia, zirconia, silica, iron oxide, ceria, magnesium oxide, and titania. A further aspect of this invention is the use of two or more types of abrasive particles in the polishing surface.

DETAILED DESCRIPTION OF THE INVENTION

Figure 1:
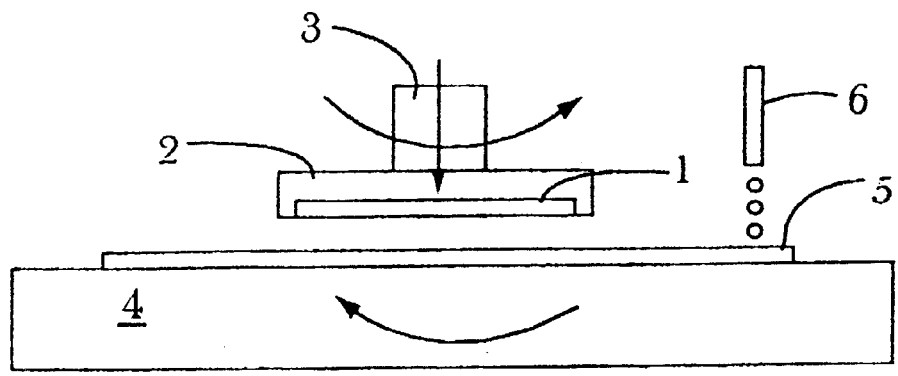
FIG. 1 is a diagram of a prior art polishing apparatus.

The present invention is a result of the recognition that a particle-containing slurry is not required for chemical-mechanical polishing activity. Instead, chemical-mechanical polishing activity in the present invention derives from the interaction of nanoasperities or particles on the pad surface with the substrate in combination with a particle-free reactive liquid solution. This absence of particles enables the incorporation of a number of desirable features into the liquid delivery system, particularly recirculation to ensure stable performance, removal of waste products, and filtration of contaminant particles.

It is apparent at the outset that apparatus of the present invention shares several major features in common with prior art polishing apparatus, namely the employment of carrier, table, pad, and the imposition of relative lateral motion between pad and substrate. In is not our intent to claim invention of those features per se. Rather it is our intent to employ these features in combination with a specific and novel variety of pad and a reactive liquid solution free of particles which may be delivered as a recirculating liquid.

Asperity contact models for chemical-mechanical polishing have been described in Cook et al. (U.S. Pat. No. 5,489,233) and Yu et al. (U.S. Pat. No. 5,441,598). However, prior art has ascribed the role of asperities as merely vehicles for the delivery of slurry particles to the substrate surface and have dealt only with the use of microasperities and macroasperities. This may arise in part from a lack of recognition of the criticality of the size ranges of asperities which occur on a pad surface. Conventional asperity contact models address asperities of sizes in the micron range and assume simple deformation to accommodate to the substrate surface. A key aspect to the present invention is a recognition of the criticality of yet smaller asperities in the interaction with the substrate in the event that they do not permanently deform during contact. These nanoasperities, of a size range equivalent to the size of slurry particles, are expected to form high local contact stresses in the substrate during the polishing process. By judicious choice of the hardness of the materials of construction, so as to avoid permanent plastic deformation of the nanoasperities, and by the use of chemically reactive liquid solutions during this contact, it is possible to effect contact-mediated reactions, which are analogous to those which occur during slurry particle contact, which result in material removal primarily in the zone of contact. This then gives rise to the same spatial selectivity as is observed during polishing with particle-containing slurries, but without the need for particles in the system. This will be made clear in the subsequent discussion and examples.

In application Ser. No. 09/384,607, which is made a part of this specification by reference, "nanoasperities" are intended to mean:

i. protrusions from the pad surface; and/or ii. particles which release from the pad surface, having an imputed radius (of curvature) of about 0.5 to about 0.1 microns and sufficient resiliency to permanently deform (measured by the permanent change in curvature during polishing) by less than 25%, more preferably less than 10%.

Application Ser. No. 09/384,607 also defines particle as intended to mean a discrete mass of material as it exists at the polishing interface. Hence, a "particle" can mean an independent, discrete primary particle, an agglomeration of primary particles which form a discrete mass, and/or primary particles which are aggregated together to form a discrete mass.

Application Ser. No. 09/384,607 also defines "particle clusters" by means of the following discussion:

High modulus phase materials, particularly sub-micron ceramic particles tend to agglomerate into much larger sized particles, and this can be a problem. Such particle agglomeration can lead to scratching and can adversely affect polishing performance.

One way to avoid such unwanted agglomeration is to first: 1. mix the particles with a suitable binder, whereby the binder is initially in a flowable form; 2. agitating or stirring the mixture to thereby break up particle agglomerations and cause dispersion of the particles within the flowable binder; 3. Curing, de-watering or otherwise solidifying the binder, thereby dispersing the particles within a (now) solid binder, and thereby also preventing the particles from re-agglomerating; and 4. grinding or otherwise breaking the resulting material into fragments. The resulting fragments will hereafter be referred to as "particle clusters." The particle clusters are then incorporated into or bonded onto the polishing layer matrix material, and the particles are thereby incorporated into the polishing pad, substantially free of unwanted particle agglomeration. Typically the particle clusters have an average size in the range of 1 to 50 microns. 5 to 10 microns are preferred.

EXAMPLE

The following example graphically illustrates the criticality of nanoasperities in maintaining the rate of the polishing process. A polyurethane polishing pad, designated EX2000, which is an example of the art disclosed in U.S. Pat. 5,489,233, was used to polish a series of 150 mm silicon wafers having on their surface a 1.5 micron thick layer of thermally oxidized $SiO_2$ (thermal oxide). A polishing slurry (designated ILD1300) consisting of an aqueous dispersion of 130 nm $SiO_2$ particles of 13% concentration by weight was used in combination with this pad on a conventional unmodified polishing machine (Westech 372) using pressures and rotations typical of industrial polishing processes for semiconductor wafers. The polishing rate of each wafer was measured. In addition, samples of the pad were removed at intervals for measurement of the surface roughness using a stylus contact profilometer. Two types of surface roughness were measured, the first, designated Ra, was the nanoroughness of the upper surfaces of the microasperities. At the onset of polishing, a value of 99 nanometers was obtained. The other roughness, designated Rpv, was the average height of the microasperities on the pad surface. At the onset of polishing, a value of 10 microns was obtained, in good agreement with literature values reported for the microasperities in similar pads (see Yu et al., U.S. Pat. No. 5,441,598).

Figure 2:
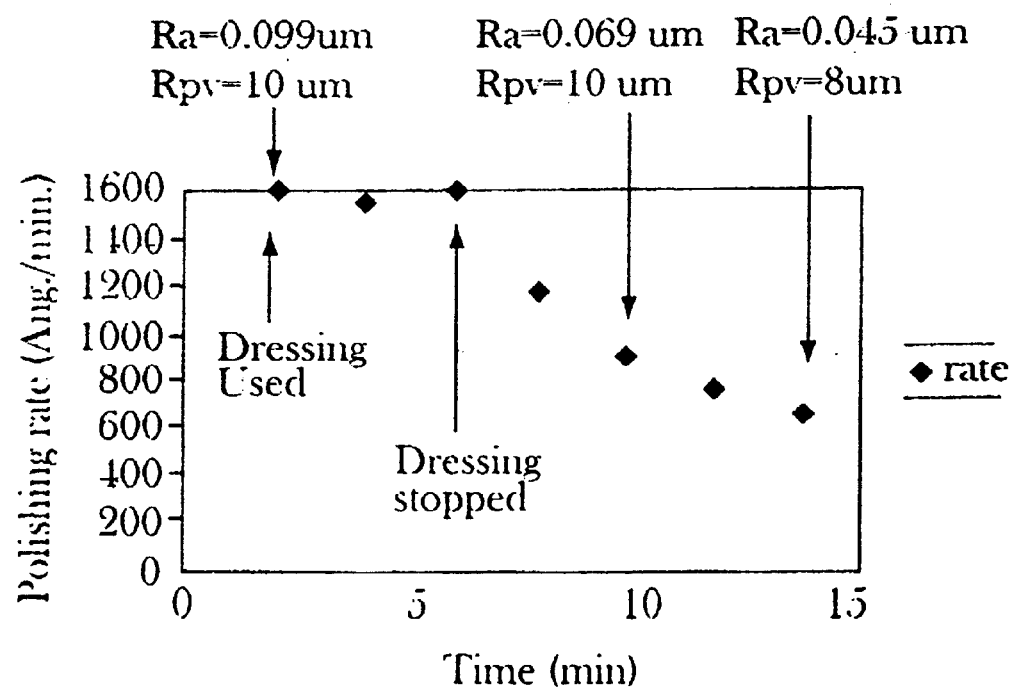
FIG. 2 is a graph showing the relationship of polishing rates to microasperities and nanoasperities.
Figure 3:
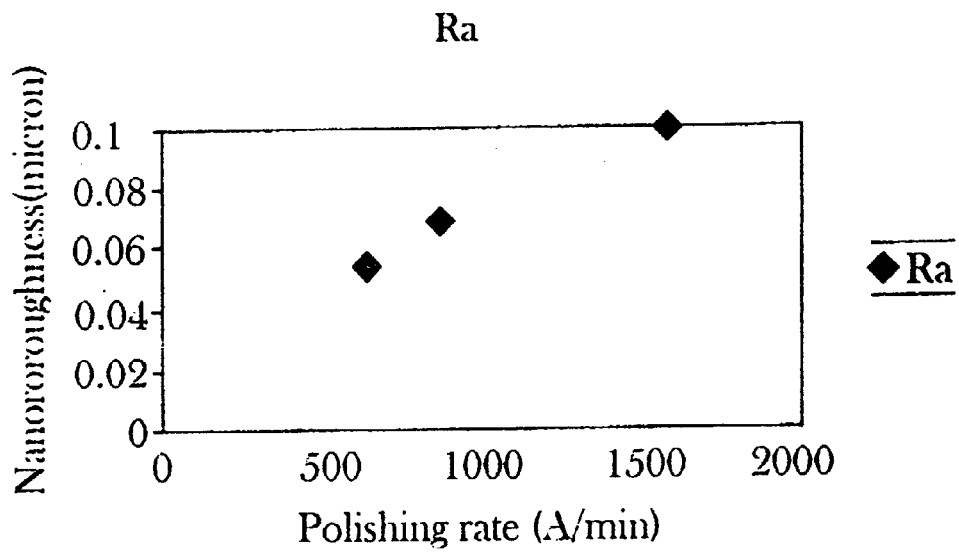
FIG. 3 is a graph of polishing rates versus nanoroughness.

Following the teaching of the U.S. Pat. No. 5,489,233, regular pad dressing was performed to maintain the surface microtexture using a bonded diamond dressing wheel. After polishing 3 wafers, pad dressing was discontinued, and an additional 4 wafers were polished. A graphic summary of the data is shown in FIGS. 2 and 3. While dressing was maintained, a high sustained polishing rate was observed. When pad dressing was stopped, an exponential decay in polishing rate was observed. Simultaneously, a linear decrease in the surface nanotexture occurred. In contrast, little or no change in the surface microtexture was observed. The linear dependence between rate and nanotexture is made clear in FIG. 3.

This pad was chosen for the example because it has no intrinsic surface structure of its own, as it is constructed from a uniform sheet of homogenous polymer. All surface texture, whether macrotexture, microtexture, or nanotexture is produced by external means. Consequently, the pad is uniquely sensitive to degradation of surface asperities, unlike other types of pads which possess surface macrotexture, microtexture, and nanotexture derived from their constituent heterogeneities. While the effects of nanoasperity removal on rate are more difficult to directly determine in these other types of pads, it will also occur, with deleterious effects on rate.

In addition, the various arguments set forth in U.S. Pat. No. 5,489,233 as regards the functionality of the simultaneous presence of both macrotexture and microtexture to effect efficient liquid flow at the pad/substrate interface are considered valid and useful in the present invention. The novel portion of the pad component of the present invention, which was not taught in this prior art, is that this combination is equally useful for the efficient transport of a non-particulate liquid, and that yet another class of surface asperities, borne on the projections of the microtexture, can effect polishing activity. Thus for apparatus of the present invention, a wide variety of pads may be selected and used for the particular purpose at hand so long as a surface concentration of nanoasperities are maintained during use in combination with a reactive liquid.

Classes of pads known to be useful include;
a. pads of U.S. Pat. No. 5,489,233 discussed above,
b. polymer impregnated fiber matrices typified by pads sold by Rodel, Inc. under the trade name SUBA
c. polymer sheet containing void spaces effected by in situ production or by incorporation of hollow filler materials, (materials of this class are typified by pads sold by Rodel, Inc. under the trade names POLITEX, and IC1000),
d. polymer sheets containing solid particles added as fillers, which may optionally contain void spaces, effected either by in situ production or by incorporation of hollow filler materials, (materials of this class are typified by pads sold by Rodel, Inc. under the trade names MH),
e. composite pads consisting of multiple layers of materials whose outer substrate-contacting surface consists of a pad selected from classes a–d, (an exemplary composite pad commonly employed in semiconductor processing is produced from an underlayer of SUBA and a substrate-contacting layer of IC1000),
f. pads of application Ser. No. 09/384,607 which comprise a plurality of abrasive particles.
g. pads of classes a–f wherein additional macrotexture such as grooves or perforations is added to further facilitate liquid transport during polishing.

It is clear from the above discussion that a variety of prior art pads have nanoasperities. However, all prior art teaches that the function of asperities of any size in the polishing process is to merely serve as vehicles for the slurry particles to contact the substrate surface. A critical and novel feature of the present invention is that the pad asperities themselves can effect polishing activity when they contact the surface in conjunction with a reactive liquid, i.e., a solution which exhibits selective reactivity or corrosion towards the substrate to be polished.

During the contact of the pad nanoasperities on the substrate surface under applied load, the load and frictional forces give rise to subsurface stresses in the substrate as well as locally elevated pressure and temperature in the liquid, (see Cook J. Non-Cryst. Solids, 1990, attached). The essential feature of the reactive liquid is that it have a selectively heightened reactivity or corrosivity to the substrate material under the local conditions of asperity contact relative to the normal state of the surface. For example, if the reactive solution shows strongly increased corrosive action to the substrate as temperature is increased, then corrosion will preferentially occur in the local environment of the nanoasperity contact (where elevated temperature occurs) relative to non-contacted portions of the substrate surface. An even more effective reactive solution is one in which the rate of corrosion is dependent upon bond strain in the substrate (stress corrosion). For example, dilute solutions of Hydrofluoric acid are well known to be corrosive to $SiO_2$ and silicate materials. The rate of corrosion is extremely sensitive to bond strain, particularly tensile strain, increasing in rate by several orders of magnitude. Such a reactive solution when used in the present invention will result in a highly selective local removal in the proximal vicinity of the nanoasperity contact due to the increased local bond strain in the substrate.

The major classes of reactive solutions suitable for use in the present invention are;
1) Solutions which exhibit a strong positive temperature dependence of the corrosion rate,
2) Solutions which exhibit a strong positive pressure dependence of the corrosion rate,
3) Solutions which exhibit a strong stress corrosion effect,
4) Solutions which passivate the substrate surface but exhibit diminished passivation effect with increasing temperature,
5) Solutions which passivate the substrate surface but exhibit diminished passivation effect with increasing pressure,
6) Solutions which passivate the substrate surface but exhibit diminished passivation effect with increasing stress.

The latter three types of solutions are particularly useful for the polishing of metal substrates wherein the metals are capable of passivation behavior. In the absence of nanoasperity contact, the passivation layer preserves the metal surface. In the proximal vicinity of the nanoasperity contact, the destabilization of dissolution of the passivation layer leads to substrate dissolution and, therefore, desirable spatially selective polishing activity.

In the practice of the present invention, the particular reactive liquid solution employed for each type of substrate will be different and optimized for the particular substrate using the general guidelines set forth above. Thus a wide variety of reactive liquid solutions may be employed. We do not claim that the reactive liquid solution formulations themselves are novel, as they may have been disclosed or employed for other uses. What is inventive, however, is the combination of the the reactive liquid solution with the pad nanoasperities or particles to effect polishing activity without the use of abrasive particles in the reactive liquid solution.

In like fashion, soluble reaction products from the substrate polishing may be easily removed from the liquid via precipitation, adsorption or ion exchange. For example, in the polishing of metals such as tungsten, soluble tungsten ions represent a significant contaminant in the liquid waste stream. In the practice of the current invention, the reactive liquid solution can be readily treated by ion exchange after polishing to remove said soluble metal ions permitting it to be reused or disposed of in a clean contaminant-free state.

An even more significant advantage is the ease with which the reactive liquid solutions of the present invention can be treated to preserve their activity and their critical properties monitored. For example, if dilute Hydrofluoric acid solutions were employed a reactive liquid solutions in the polishing of silica and silicates in a recirculating system, the pH and HF concentration may be precisely measured in situ before and after use by the use of pH and specific ion electrodes. Provisions for addition of additional HF into the solution as needed to maintain a constant acid concentration and pH can be easily introduced into the recirculation system.

For the case where the reactive liquid solution relies on metal passivation effects for activity, similar measurement and control systems may be employed. For example, if the reactive liquid solution for metal polishing consisted of 50 ppm Ozone in water at pH4, the oxidation potential of the solution (directly proportional to the ozone concentration) and the pH may be measured at any point in a recirculation loop with conventional electrodes. Provisions for addition of additional acid and ozone into the solution as needed to maintain constant pH and oxidation potential can then be easily introduced into the recirculation system.

Figure 4:
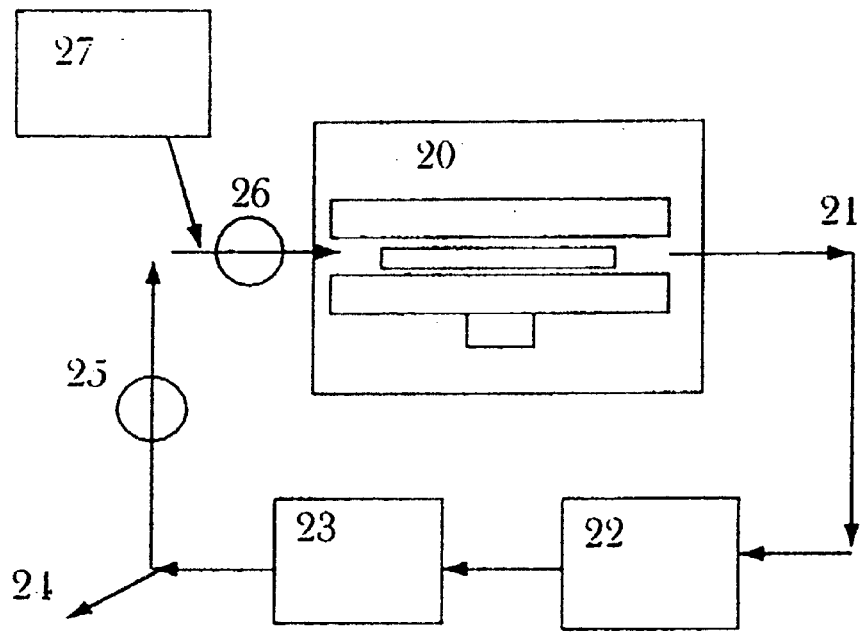
FIG. 4 is a schematic diagram of an apparatus for polishing of the present invention.

All of these elements can, therefore, be combined into a polishing system which permits closed loop recirculation of the process liquids employed. This is shown schematically in FIG. 4. The polishing is performed using a table and pad contacting the substrate together with a reactive liquid solution. This portion of the apparatus is labeled 20. The recirulation line 21 carries the used reactive liquid to a filter 22 and an ion exchanger 23 which remove contaminants from the solution. Any excess liquid may be sent off as waste

24. Following contaminant removal the properties of the reactive liquid solution are measured via sensors 25, and adjusted with fresh chemical additives 27 to yield a reactive liquid solution of properties equivalent to the fresh solution. The final properties of the liquid are measured via a second set of sensors 26 prior to re-use.

It may be appreciated that such an apparatus lends itself to closed loop control of properties with corresponding reductions in labor cost and variability. It should also be noted that this example is only illustrative of the concepts; a wide variety of particular systems can be constructed to fit the particular needs at hand by one skilled in the art.

What is claimed is:

1. A method of polishing a surface of a semiconductor wafer comprising the steps of:
   (a) providing a polishing pad having a polishing surface comprising a multiplicity of one type of abrasive particle in said polishing surface;
   (b) holding said wafer in a carrier such that said wafer surface is in contact with said polishing surface;
   (c) moving said carrier and/or said polishing surface to provide both pressure on said wafer surface and relative lateral motion between said wafer surface and said polishing surface; and
   (d) providing a reactive liquid solution essentially free from particulate matter at an interface between said wafer surface and said polishing surface, wherein a change in polishing conditions is effected by changing the ionic strength of said reactive liquid solution.

2. The method according to claim 1 wherein said abrasive particles are metal oxide.

3. The method according to claim 1 further comprising the step of recirculating said reactive liquid solution through said interface.

4. The method according to claim 1 wherein said polishing pad is a solid polymer sheet containing abrasive particles.

5. The method according to claim 1 wherein said polishing surface comprises a multiplicity of two or more types of abrasive particles.

6. The method according to claim 5 wherein said types of abrasive particles are from the group consisting of metal oxides such as alumina, chromia, zirconia, silica, iron oxide, ceria, magnesium oxide, and titania.

* * * * *

UNITED STATES PATENT AND TRADEMARK OFFICE
CERTIFICATE OF CORRECTION

PATENT NO. : 6,537,137 B2
DATED : March 25, 2003
INVENTOR(S) : Oliver et al.

It is certified that error appears in the above-identified patent and that said Letters Patent is hereby corrected as shown below:

<u>Title page,</u>
Item [75], the Inventors names should read:

-- Michael R. Oliver, Portland, OR
Lee Melbourne, Steelville, PA
David B. James, Newark, De
William D. Budinger, Key West, FL --

Signed and Sealed this

Twenty-fourth Day of August, 2004

JON W. DUDAS
*Director of the United States Patent and Trademark Office*